United States Patent
Kabe et al.

(10) Patent No.: US 8,389,420 B2
(45) Date of Patent: Mar. 5, 2013

(54) METHOD AND APPARATUS FOR FORMING SILICON OXIDE FILM

(75) Inventors: Yoshiro Kabe, Amagasaki (JP); Hideo Nakamura, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/074,062

(22) Filed: Mar. 29, 2011

(65) Prior Publication Data

US 2011/0171835 A1 Jul. 14, 2011

Related U.S. Application Data

(63) Continuation of application No. PCT/JP2009/066588, filed on Sep. 25, 2009.

(30) Foreign Application Priority Data

Sep. 30, 2008 (JP) ................................. 2008-253931

(51) Int. Cl.
*H01L 21/31* (2006.01)
(52) U.S. Cl. ................. 438/771; 257/E21.24; 118/723 I
(58) Field of Classification Search .................. 438/771; 257/E21.24; 118/723 I
See application file for complete search history.

(56) References Cited

U.S. PATENT DOCUMENTS

| | | | |
|---|---|---|---|
| 6,228,751 B1 * | 5/2001 | Yamazaki et al. | 438/585 |
| 2006/0156984 A1 * | 7/2006 | Nozawa et al. | 118/723 R |
| 2010/0015815 A1 * | 1/2010 | Shiozawa et al. | 438/772 |
| 2010/0136797 A1 * | 6/2010 | Kabe et al. | 438/772 |

FOREIGN PATENT DOCUMENTS

| | | |
|---|---|---|
| JP | 07-029898 A | 1/1995 |
| JP | 2003-282567 A | 10/2003 |
| JP | 2008-091409 A | 4/2008 |
| JP | 2008-124424 A | 5/2008 |
| JP | 2008-251855 A | 10/2008 |
| WO | 2004/008519 A1 | 1/2004 |
| WO | 2006/129643 A1 | 12/2006 |

OTHER PUBLICATIONS

International Search Report for International Application No. PCT/JP2009/066588, with a mailing date of Oct. 20, 2009, two (2) pages.

* cited by examiner

*Primary Examiner* — Alexander Ghyka
*Assistant Examiner* — Stanetta Isaac
(74) *Attorney, Agent, or Firm* — Nath, Goldberg & Meyer; Jerald L. Meyer (57) ABSTRACT

A method of forming a silicon oxide film on silicon exposed on a surface of a workpiece includes mounting the workpiece on a mounting table in a processing chamber; generating plasma of a process gas containing oxygen by supplying the process gas into the processing chamber; applying a bias to the workpiece by supplying high-frequency power to the mounting table; and forming the silicon oxide film by applying the plasma to the biased workpiece and oxidizing the silicon. A ratio of oxygen in the process gas is set to be in the range of 0.1% to 10%. A pressure in the processing chamber is set to be in the range of 1.3 Pa to 266.6 Pa upon forming the silicon oxide film. An output of the high-frequency power is set to be in the range of 0.14 W/cm² to 2.13 W/cm² per unit area of the workpiece.

11 Claims, 6 Drawing Sheets

METHOD AND APPARATUS FOR FORMING SILICON OXIDE FILM

CROSS-REFERENCE TO RELATED APPLICATIONS

This application is a Continuation Application of PCT International Application No. PCT/JP2009/066588, filed on Sep. 25, 2009, which claims the benefit of Japanese Patent Application No. 2008-253931, filed on Sep. 30, 2008, the entire content of each of which is hereby incorporated by reference.

TECHNICAL FIELD

Embodiments described herein relate to a method and an apparatus for forming a silicon oxide film ($SiO_2$) having superior properties, which is applicable to, for example, a gate insulating film.

BACKGROUND

Methods for forming a silicon oxide film through oxidation of a silicon surface may be generally classified into a thermal oxidation process using an oxidation furnace or a rapid thermal process (RTP) apparatus, and a plasma oxidation process using a plasma process apparatus.

As an example of a thermal oxidation process, in a wet oxidation process through an oxidation furnace, a silicon substrate is heated to a temperature of more than 800° C. (degree Celsius) and exposed to an oxidation atmosphere by using a water vapor generator (WVG), thereby oxidizing a surface of the silicon substrate to form a silicon oxide film thereon. Such a thermal oxidation process is considered as a method for forming a silicon oxide film of good quality. The thermal oxidation process, however, requires a treatment at a high temperature of more than 800° C. such that thermal budgets are increased to cause deformation of a silicon wafer due to thermal stress.

On the other hand, with respect to a plasma oxidation process, WO 2004/008519 proposes a method of forming a silicon oxide film by performing a plasma oxidation process in which a silicon surface reacts with a microwave-excited plasma formed at a process pressure of 133.3 Pa by using a process gas containing argon gas and oxygen gas and having a flow rate ratio of oxygen of about 1%.

According to the method disclosed in WO 2004/008519, the plasma oxidation process is performed at a relatively low process temperature of about 400° C., which can avoid the problems such as an increase in thermal budgets and deformation of a substrate that may occur in a thermal oxidation process.

Also, WO 2004/008519 discloses that a plasma is formed under conditions of low pressure and low oxygen density in which a flow rate ratio of oxygen is about 1% and a process pressure is 133.3 Pa. The plasma oxidation process is performed on a silicon surface under conditions such as low pressure and low oxygen density so that a higher oxidation rate may be obtained. Defects of Si—O combinations, however, are introduced into a silicon oxide film that is obtained through a plasma oxidation process under the conditions of low pressure and low density. Such defects cause an initial withstanding voltage to be poor to thereby reduce the yield of devices. This problem may be improved by performing a plasma oxidation process under conditions at a relatively high process pressure (e.g., 400 Pa) and a relatively high oxygen density (e.g., 20%). However, as process pressure and oxygen density increase, the oxidation rate is dropped to thereby reduce throughput. In addition, the increase in process pressure and oxygen density deteriorates a flatness of a surface of a silicon oxide film or a $Si/SiO_2$ interface so as to cause degradation in durability as an insulating film.

Therefore, Japanese Laid-Open Patent Publication No. 2008-91409 proposes a method of forming a silicon oxide film with superior insulating properties while not damaging the advantages of a plasma oxidation process under conditions of low pressure and low oxygen density. This method includes a first oxidation treatment process for forming a silicon oxide film using a plasma that is formed under first treatment conditions in which a ratio of oxygen in a process gas is 1% or less and the pressure ranges from 0.133 to 133 Pa, and a second oxidation treatment process for forming a silicon oxide film using a plasma that is formed under second treatment conditions in which a ratio of oxygen in a process gas is 20% or more and the pressure ranges from 400 to 1333 Pa.

To follow a recent miniaturization of a semiconductor device, it is required in a gate insulating film of, for example, a transistor, a flash memory device or the like to have a film quality whose insulating property does not deteriorate even when stress is repeatedly applied and with a high insulation durability so as to sufficiently restrain a leak current from occurring. Also, in recent years, from a perspective of improving total throughput by way of increasing sheets of semiconductor wafers to be processed, there is a need to upgrade an oxidation rate so as to form a silicon oxide film with a predetermined film thickness in a short period of time. With respect to the two requirements having a different direction as above, it was difficult to satisfy both of them at the same time with the conventional plasma oxidation process methods.

For example, Japanese Laid-Open Patent Publication No. 2008-91409 discloses a method of forming a silicon oxidation film through a two-step plasma oxidation process comprising a condition of low pressure and oxygen density and another condition of relatively higher pressure and oxygen density than those in the former condition. This method intends to obtain a fine silicon oxide film with less defects by maintaining a high oxidation rate as well as the flatness of a surface of the silicon oxide film and a $Si/SiO_2$ interface through the low pressure and oxygen density condition while suppressing defects in the silicon oxide film due to the low pressure and oxygen density conditions. However, such technique essentially employs the two-step plasma oxidation process such that there still remains room for improvement in terms of throughput.

SUMMARY

It is, therefore, an object of some embodiments of the present disclosure to provide a method and an apparatus for forming, in a short period of time, a silicon oxide film having superior insulating properties applicable to a film, e.g., a gate insulating film.

According to one aspect of the present disclosure, there is provided a method of forming a silicon oxide film on silicon exposed on a surface of a workpiece to be processed. The silicon oxide film forming method includes mounting the workpiece on a mounting table in a processing chamber; generating a plasma of a process gas containing oxygen by supplying the process gas into the processing chamber; applying a bias to the workpiece by supplying high-frequency power to the mounting table; and forming the silicon oxide film by applying the plasma to the biased workpiece and oxidizing the silicon, wherein a ratio of oxygen in the process gas is set to be in the range of 0.1% to 10%, a pressure in the processing chamber is set to be in the range of 1.3 Pa to 266.6 Pa upon forming the silicon oxide film, and an output of the high-frequency power is set to be in the range of 0.14 W/cm$^2$ to 2.13 W/cm$^2$ per unit area of the workpiece.

According to another aspect of the present disclosure, there is provided an apparatus that forms a silicon oxide film. The silicon oxide film forming apparatus includes a processing chamber having an opening at an upper portion of the processing chamber, the processing chamber configured to process a workpiece to be processed by using plasma; a dielectric member configured to cover the opening of the processing chamber; an antenna disposed on an outside portion of the dielectric member, the antenna configured to introduce an electromagnetic wave into the processing chamber; a gas introducing unit configured to be connected to a gas supply system for supplying a process gas containing oxygen into the processing chamber; a gas exhaust conduit configured to be connected to a vacuum pump for depressurizing and exhausting the interior of the processing chamber; a mounting table configured to mount the workpiece in the processing chamber; a high-frequency power source configured to be connected to the mounting table; and a control unit configured to supply the process gas containing oxygen at a ratio of oxygen in the process gas in the range of 0.1% to 10% from the gas supply system into the processing chamber, set a pressure in the processing chamber to be in the range of 1.3 Pa to 266.6 Pa, generate the plasma of the process gas containing oxygen by introducing the electromagnetic wave from the antenna into the processing chamber as well as supply to the mounting table a high-frequency power in the range of 0.14 W/cm$^2$ to 2.13 W/cm$^2$ per unit area of the workpiece from the high-frequency power source, thereby applying an RF (Radio Frequency) bias to the workpiece, and form the silicon oxide film on a silicon exposed on a surface of the workpiece by applying the plasma of the process gas containing oxygen to the silicon.

BRIEF DESCRIPTION OF THE DRAWINGS

FIG. 7 is a cross-sectional view of an example of a semiconductor memory device that a method according to an embodiment of the present disclosure can be applied to.

FIG. 8 is a cross-sectional view of another example of the semiconductor memory device that a method according to an embodiment of the present disclosure can be applied to.

DETAILED DESCRIPTION

Figure 1:
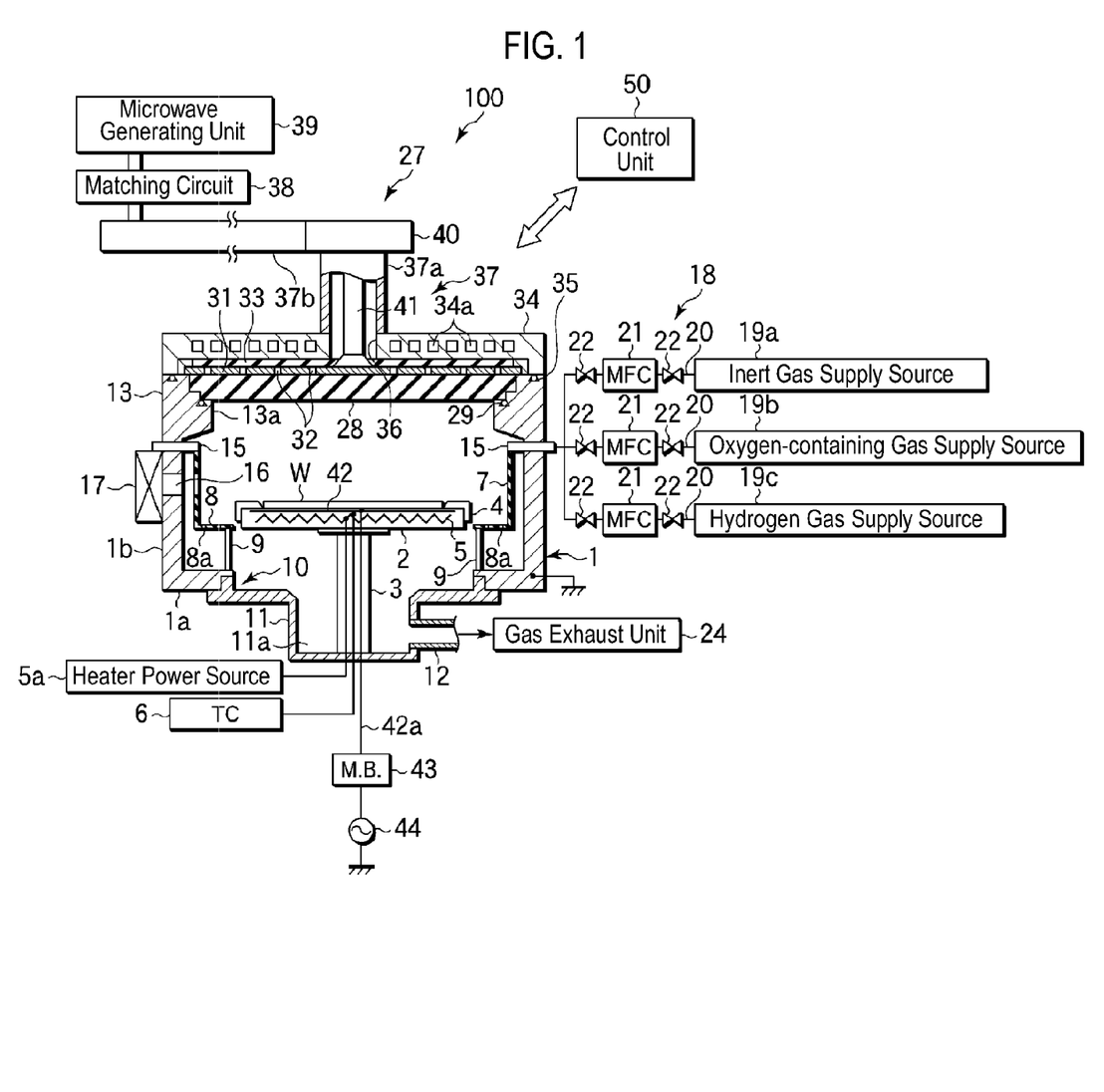
FIG. 1 is a schematic cross-sectional view showing an example of a plasma oxidation processing apparatus applicable to a silicon oxide film forming method in accordance with an embodiment of the present disclosure.
Figure 2:
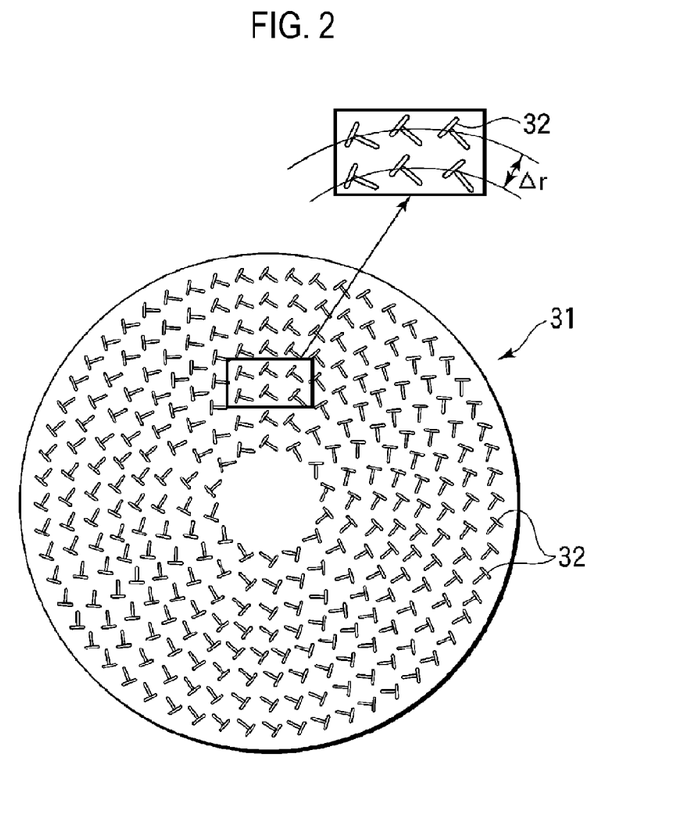
FIG. 2 is a plan view showing a configuration of a planar antenna of the plasma oxidation processing apparatus shown in FIG. 1.

Embodiments will now be described in detail with reference to the accompanying drawings. FIG. 1 is a schematic cross-sectional view showing a plasma oxidation processing apparatus 100 that is applicable to a silicon oxide film forming method in accordance with an embodiment of the present disclosure. Also, FIG. 2 is a plan view showing a planar antenna of the plasma oxidation processing apparatus 100 shown in FIG. 1.

The plasma oxidation processing apparatus 100 is configured as a radial line slot antenna (RLSA) microwave plasma processing apparatus which is capable of generating a microwave-excited plasma of a high density and a low electron temperature by generating the plasma in a processing chamber while introducing a microwave thereinto directly through the planar antenna having a number of slot-shaped holes, e.g., an RLSA. With the plasma oxidation processing apparatus 100, a plasma process may be carried out by using a plasma having a plasma density ranging from $1 \times 10^{10}$ to $5 \times 10^{12}$/cm$^3$ and a low electron temperature ranging from about 0.7 to 2 eV. Therefore, the plasma oxidation processing apparatus 100 may be appropriately employed in a manufacturing process of various semiconductor devices, for the purpose of forming a silicon oxide film (e.g., a SiO$_2$ film).

The plasma oxidation processing apparatus 100 includes, as major components, a processing chamber 1, a gas introducing member 15, a gas exhaust unit 24, a microwave introducing system 27, and a control unit 50. The processing chamber 1 is configured to be air-tightly sealed. The gas introducing member 15 is configured to be connected to a gas supply system 18. The gas supply system 18 is configured to supply gas into the processing chamber 1. The exhaust unit 24 is configured to depressurize and exhaust the interior of the processing chamber 1. The microwave introducing system 27 is disposed on top of the processing chamber 1 to introduce a microwave thereinto. The control unit 50 is configured to control the components of the plasma oxidation processing apparatus 100.

The processing chamber 1 is made of a substantially cylindrical chamber which is grounded. Also, the processing chamber 1 may be made of an angular chamber. The processing chamber 1 is provided with a bottom wall 1$a$ and a side wall 1$b$ which are made of a material such as aluminum.

A mounting table 2 is disposed in the processing chamber 1 to horizontally mount thereon a wafer W, which is a wafer to be processed. The mounting table 2 is made of ceramics, for example, AlN, Al$_2$O$_3$ and the like. Among these, in some embodiments, a material having a high thermal conductivity, e.g., AlN may be employed.

The mounting table 2 is supported by a cylindrical support member 3 extending upward from a central bottom portion of a gas exhaust chamber 11. The support member 3 is made of ceramics, for example, AlN and the like.

A cover member 4 is also disposed on the mounting table 2, for covering an outer peripheral portion or the whole surface of the mounting table 2 and guiding the wafer W. The cover member 4 is formed in an annular shape to cover a mounting surface and/or a lateral side of the mounting table 2. If the cover member 4 covers the whole surface of the mounting table 2, the wafer W is mounted on the cover member 4. The cover member 4 serves to block contact between the mounting table 2 and a plasma, thereby preventing a sputtering and an adulteration of the wafer W with impurities. The cover member 4 is made of a material, e.g., quartz, a single crystalline silicon, a poly crystalline silicon, an amorphous silicon, SiN and the like. Among these, in some embodiments, quartz having a superior decomposition property against a plasma may be used. In some embodiments, a material of the cover member 4 may be a material of high purity containing a very small amount of impurities, such as an alkali metal, a metal and the like.

A heater 5 of a resistance heating type is embedded in the mounting table 2. The heater 5 is configured to heat up the mounting table 2 by being supplied with a power from a heater power supply 5a, and thus the wafer W to be processed is uniformly heated up by the mounting table 2 that has been heated up by the heater 5.

Also, a thermocouple (TC) 6 is disposed on the mounting table 2. By monitoring the temperature through the thermocouple 6, the heating temperature of the wafer W may be controlled to range from room temperature to 900° C. (degree Celsius), for example.

The mounting table 2 is further provided with wafer supporting pins (not shown) which serve to transfer the wafer W upon being carried into the processing chamber 1. Each of the wafer supporting pins is configured to be protrusible above and retractable below the surface of the mounting table 2.

A cylindrical liner 7 made of quartz is disposed on an inner periphery of the processing chamber 1. Also, a baffle plate 8, which is made of quartz and provided with a plurality of gas exhaust holes 8a, is annularly disposed at an outer peripheral side of the mounting table 2 so as to evacuate the interior of the processing chamber 1 uniformly. The baffle plate 8 is supported by a number of supporting columns 9.

A circular opening 10 is provided at a substantially central portion of a bottom wall 1a of the processing chamber 1. The gas exhaust chamber 11 communicating with the opening 10 is provided at the bottom wall 1a and protrudes downward therefrom so as to cover the opening 10. The gas exhaust chamber 11 is connected to a gas exhaust conduit 12. The gas exhaust conduit 12 is connected to the gas exhaust unit 24. With the described configuration, the interior of the processing chamber 1 may be vacuum-exhausted.

A lid frame 13 with an opening is disposed on top of the processing chamber 1. An inner periphery of the lid frame 13 protrudes toward an inner side (e.g., the inner space of the processing chamber 1) to form an annular supporting portion 13a.

The gas introducing member 15 which has an annular shape is disposed on a sidewall 1b of the processing chamber 1. The gas introducing member 15 is connected to the gas supplying system 18 that supplies an oxygen-containing gas and a plasma excitation gas. The gas introducing member 15 may have the shape of a nozzle or shower head.

At the sidewall of the processing chamber 1, there are provided a loading/unloading port 16 for loading and unloading the wafer W between the plasma oxidation processing chamber 100 and a transfer chamber (not shown) adjacent thereto, and a gate valve 17 for opening and closing the loading/unloading port 16.

The gas supply system 18 includes, for example, an inert gas supply source 19a, an oxygen-containing gas supply source 19b, and a hydrogen gas supply source 19c. Also, the gas supply system 18 may further include, for example, a purge gas supply source for supplying a purge gas that is used for substituting an atmosphere in the processing chamber 1, and a cleaning gas supply source for cleaning the interior of the processing chamber 1, as additional gas supply sources which are not shown.

As for the inert gas, $N_2$ gas, a rare gas, or the like may be used, for example. Also, as for the rare gas, Ar gas, Kr gas, Xe gas, He gas or the like may be used. Among these rare gases, in some embodiments, Ar gas may be used due to its excellent economic feasibility. Further, as for the oxygen-containing gas, oxygen gas $O_2$, nitrogen monoxide gas NO, nitrogen dioxide gas $N_2O$, or the like may be used.

An inert gas, an oxygen-containing gas, and a hydrogen gas are respectively supplied from the inert gas supply source 19a, the oxygen-containing gas supply source 19b, and the hydrogen gas supply source 19c of the gas supply system 18 to the gas introducing member 15 through respective gas lines 20 (e.g., piping lines), and then introduced into the processing chamber 1 through the gas introducing member 15. Each of the gas lines 20, which is connected to the corresponding gas source, is provided with a mass flow controller 21 and opening/closing valves 22 that are disposed at upstream and downstream sides of the mass flow controller 21. With such a configuration of the gas supply system 18, the switching and flow control of gas being supplied may be accomplished.

The gas exhaust unit 24 serving as an exhaust system is provided with a high speed vacuum pump, for example, a turbo-molecular pump and the like. The gas exhaust unit 24 is connected to the gas exhaust chamber 11 of the processing chamber 1 through the gas exhaust conduit 12. The gas in the processing chamber 1 uniformly flows into a space 11a of the gas exhaust chamber 11 and then exhausted outside through the gas exhaust conduit 12 by operating the gas exhaust unit 24 from the space 11a. Accordingly, the processing chamber 1 may be rapidly depressurized to a predetermined vacuum level, for example, 0.133 Pa.

Next, a configuration of the microwave introducing system 27 will be described. The microwave introducing system 27 includes, as major components, a microwave transmitting plate 28, a planar antenna 31, a retardation material member 33, a metal cover 34, a waveguide 37, a matching circuit 38, and a microwave generating unit 39.

The microwave transmitting plate 28 serving as a dielectric member is disposed on the supporting portion 13a that is inwardly protruded in the lid frame 13. The microwave transmitting plate 28 is made of a dielectric material, e.g., quartz, or ceramic such as $Al_2O_3$, AlN, or the like, to allow a microwave to pass therethrough. The microwave transmitting plate 28 and the supporting portion 13a are air-tightly sealed via a seal member 29 such as an O-ring. Therefore, the interior of the processing chamber 1 is hermetically kept.

The planar antenna 31 serving as an antenna is disposed on top of the microwave transmitting plate 28 (e.g., the outside of the processing chamber 1) to face the mounting table 2. The planar antenna 31 is formed in a circular plate-shape. The planar antenna 31, however, is not limited to a circular plate-shape, it may have other shapes, e.g., a rectangular plate-shape in some embodiments. The planar antenna 31 is held by a top end of a lid frame 13.

The planar antenna 31 is made of a copper, aluminum, nickel plate, or conductive member of an alloy thereof whose surfaces are plated with gold or silver, for example. The planar antenna 31 is provided with a plurality of slot-shaped microwave radiation holes 32 for radiating a microwave. The microwave radiation holes 32 are formed through the planar antenna 31 in a certain pattern.

Each of the microwave radiation holes 32 has, for example, an elongated rectangular shape (e.g., a slot shape) as shown in FIG. 2. And, every two neighboring holes 32 are typically arranged in an L-shape. As such, these microwave radiation holes 32 are concentrically arranged.

A length of the respective microwave radiation holes 32 and an arrangement interval therebetween are determined depending on a wavelength $\lambda_g$ of the microwave. For example, the microwave radiation holes 32 are disposed at an interval ranging from $\lambda_g/4$ to $\lambda_g$. In FIG. 2, a radial interval between the adjacent holes 32 concentrically arranged is defined as Ar. Further, in some embodiments, the respective microwave radiation holes 32 may have another shape such as a circular shape, an arc shape and the like. Moreover, an arrangement pattern of the microwave radiation holes 32 is not limited to the concentric circular pattern exemplified herein, but they may be arranged in, for example, a spiral pattern, a radial pattern or the like.

On a top surface of the planar antenna 31 (e.g., on a flat waveguide formed between the planar antenna 31 and a metal cover 34), there is disposed the retardation material member 33 having a dielectric constant greater than that of a vacuum. The wavelength of a microwave becomes long under vacuum, and the retardation material member 33 functions to shorten the wavelength of the microwave to thereby control the plasma. As a material of the retardation material member 33, quartz, a polytetrafluoroethylene resin, a polyimide resin and the like may be used, for example.

Further, the planar antenna 31 and the microwave transmitting plate 28, or the retardation material member 33 and the planar antenna 31 may be configured to be in contact with each other or separated apart from each other. In some embodiments, they may be preferably configured to be in contact with each other.

The metal cover 34 is disposed on a top portion of the processing chamber 1 to cover the planar antenna 31 and the retardation material member 33. The metal cover 34 is made of a metal material, for example, aluminum, stainless steel, or the like. The flat waveguide is configured by the metal cover 34 and the planar antenna 31 such that the microwave is allowed to uniformly propagate to the processing chamber 1. A top portion of the lid frame 13 and the metal cover 34 are sealed through a seal member 35. Further, a cooling water path 34a is formed in the wall of the metal cover 34. By flowing cooling water through the cooling water path 34a, the metal cover 34, the retardation material member 33, the planar antenna 31, and the microwave transmitting plate 28 are cooled. Also, the metal cover 34 is grounded.

An opening 36 is formed on the center of a top wall (e.g., a roof portion), and an end portion of a waveguide 37 is connected to the opening 36. The microwave generating unit 39 for generating microwaves is connected to the other end portion of the waveguide 37 through a matching circuit 38.

The waveguide 37 includes a coaxial waveguide 37a having a circular cross section and extending upward from the opening 36 of the metal cover 34, and a horizontally extending rectangular waveguide 37b connected to an upper end of the coaxial waveguide 37a via a mode converter 40. The mode converter 40 functions to convert a TE mode of a microwave, which propagates through the rectangular waveguide 37b, into a TEM mode.

An internal conductor 41 extends in a center portion of the coaxial waveguide 37a. A low end of the internal conductor 41 is fixedly connected to the center of the planar antenna 31. With such configuration, the microwave is allowed to uniformly propagate to the flat waveguide, which is formed by the planar antenna member 31, radially and efficiently via the internal conductor 41 of the coaxial waveguide 37a.

Through the microwave introducing system 27 having the above configuration, the microwave generated from the microwave generating unit 39 propagates to the planar antenna 31 through the waveguide 37, thereby being introduced into the processing chamber 1 from the microwave radiation holes 32 (e.g., the slots) via the microwave transmitting plate 28. Also, a frequency of the microwave may be, for example, 2.45 GHz. In some embodiments, a microwave having a frequency of 8.35 GHz or 1.98 GHz may be used.

An electrode 42 is disposed and embedded in a surface side of the mounting table 2. The electrode 42 is connected to a high-frequency power source 44 for supplying a bias through a feed line 42a via a matching box (M.B.) 43. With such configuration, by supplying a high-frequency power to the electrode 42, the bias is applied to the wafer W that is a substrate. The electrode 42 is made of a conductive material, for example, molybdenum, tungsten, or the like. The electrode 42 may be formed in, for example, a mesh shape, a lattice shape, a vortex type, or the like.

Figure 3:
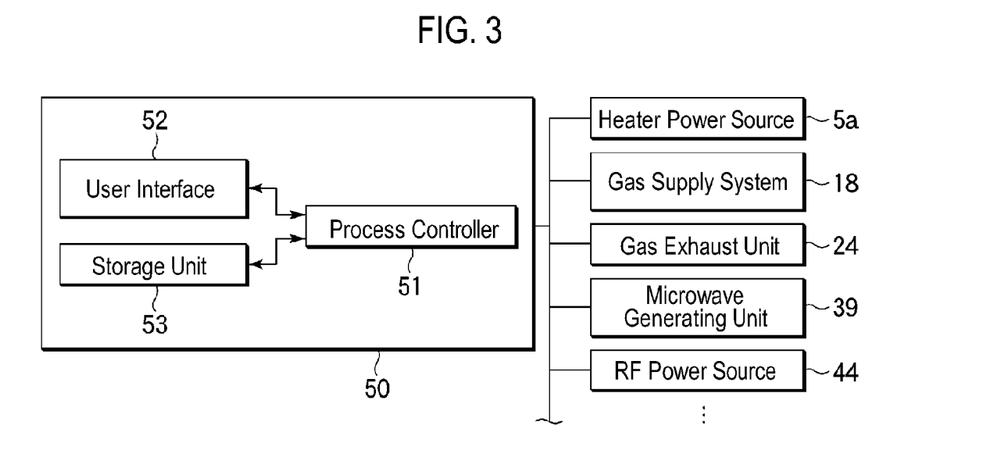
FIG. 3 is a block diagram showing a configuration of a control unit of the plasma oxidation processing apparatus shown in FIG. 1.

Each component of the plasma oxidation processing apparatus 100 is connected to and controlled by the control unit 50. The control unit 50 may be implemented as a computer. As shown in FIG. 3, the control unit 50 includes a process controller 51 provided with a central processing unit (CPU), a user interface 52 connected to the process controller 51, and a storage unit 53 connected thereto, for example.

The process controller 51 is configured to control the components (for example, the heater power source 5a, the gas supplying system 18, the gas exhaust unit 24, the microwave generating unit 39, the high-frequency source 44, and the like) which are associated with process conditions, e.g., a temperature, a pressure, a gas flow, a microwave output, a high-frequency output for applying a bias, and the like, in the plasma oxidation processing apparatus 100.

The user interface 52 includes a keyboard for a process manager to input commands to operate the plasma oxidation processing apparatus 100, and a display for visualizing and showing an operational status of the plasma oxidation processing apparatus 100. The storage unit 53 stores recipes including control programs (software), processing condition data, and the like to be used in realizing various processes, which are performed in the plasma oxidation processing apparatus 100 under the control of the process controller 51.

When receiving a command through the user interface 52, the process controller 51 retrieves and executes a necessary recipe from the memory unit 53, and a desired process is performed in the processing chamber 1 of the plasma oxidation processing apparatus 100 under the control of the process controller 51. The recipes including the control programs, the processing condition data, and the like may be used in a state of being stored in a computer-readable storage medium, for example, CD-ROM, a hard disk, a flexible disk, a flash memory, DVD, a blu-ray disc, or the like. Alternatively, the recipes may be used by being transmitted, when needed, from another apparatus through, e.g., a dedicated network.

The plasma oxidation processing apparatus 100 configured as described above is capable of performing a damage-free plasma process on a bottom film or the substrate (e.g., the wafer W) at 600° C. or lower, for example, a lower temperature ranging from a room temperature (e.g., about 25° C.) to 600° C. Also, the plasma oxidation processing apparatus 100 is capable of generating a plasma of an excellent uniformity such that the uniformity of processes may be realized with respect to a large-diameter wafer W (e.g., a workpiece to be processed).

Figure 4A:
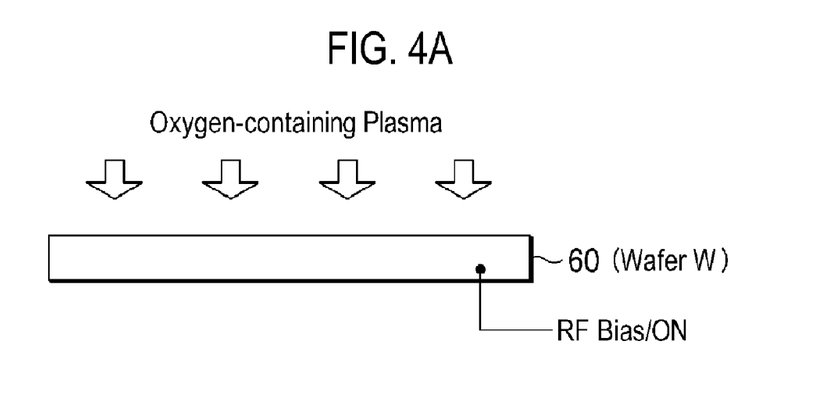
FIGS. 4A and 4B are diagrams showing plasma oxidation treatment processes.
Figure 4B:
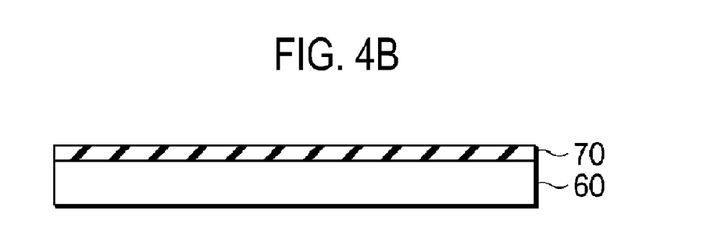

With reference to FIGS. 4A and 4B, a plasma oxidation process using the RLSA plasma oxidation processing apparatus 100 will be described below. Initially, the gate valve 17 is opened and then the wafer W is carried into the processing chamber 1 to be placed on the mounting table 2.

Thereafter, the processing chamber 1 is depressurized and exhausted, and at the same time, an inert gas and an oxygen-containing gas, and further hydrogen gas if necessary, are introduced into the processing chamber 1 at a predetermined flow rate through the gas introducing member 15 from the inert gas supply source 19a, the oxygen-containing gas supply source 19b, and the hydrogen gas supply source 19c of the gas supply system 18. In this way, the processing chamber 1 is controlled to a predetermined pressure.

Subsequently, a microwave of a predetermined frequency, e.g., 2.45 GHz, generated from the microwave generating unit 39 is introduced into the waveguide 37 through the matching circuit 38. The microwave introduced into the waveguide 37 passes through the rectangular waveguide 37b and then the coaxial waveguide 37a, thereby being supplied to the planar antenna 31 through the internal conductor 41. That is, the microwave propagates in the TE mode within the rectangular waveguide 37b. Then, the TE mode of the microwave is converted into the TEM mode by the mode converter 40, and the microwave in the TEM mode propagates within the coaxial waveguide 37a toward the planar antenna 31. Thereafter, the microwave is radiated from the microwave radiation holes 32 of the slot shape, which is formed through the planar antenna 31, to a space above the wafer W in the processing chamber 1 through the microwave transmitting plate 28. An output of the microwave at this time may be selected, as a power density, for example, in the range of 0.255 to 2.55 W/cm$^2$.

Due to the microwave radiated from the planar antenna 31 into the processing chamber 1 through the microwave transmitting plate 28, an electromagnetic field is generated in the processing chamber 1 to convert a process gas such as the inert gas, the oxygen-containing gas, and the like into a plasma. The wafer W to be processed is exposed to the plasma by which as shown in FIG. 4A, radicals and ions within the oxygen-containing plasma act on a silicon layer of the wafer W. Thus, as shown in FIG. 4B, a surface of the silicon layer 60 is oxidized such that a silicon oxide film 70 is formed. The silicon layer 60 includes a single crystalline silicon, a poly crystalline silicon, or an amorphous silicon, for example.

During the plasma oxidation process, a high-frequency power of a predetermined frequency and power is supplied from the high-frequency power source 44 to the electrode 42 of the mounting table 2. Due to the high-frequency power supplied from the high-frequency power source 44, an RF (Radio Frequency) bias is applied to the wafer W to promote the plasma oxidation process while maintaining a low electron temperature of 0.7 to 2 eV in the plasma. That is, the RF bias serves to attract the oxygen ions in the plasma toward the wafer W such that the oxidation rate of silicon becomes higher. Thus, the ions of active species for oxidation are attracted toward the wafer W due to the RF bias such that the silicon oxide film 70 may be formed.

The microwave-excited plasma used in this embodiment of the present disclosure is caused to have a high density of about $1\times10^{10}$ to $5\times10^{12}$/cm$^3$, and also to have a low electron temperature of about 1.2 eV or lower in the proximity of the wafer W because the microwave is radiated through the microwave radiation holes 32 of the planar antenna 31. The plasma thus generated inflicts less plasma damage by ions or the like on the substrate (e.g., the wafer W). As a result, the plasma oxidation process is performed on the silicon layer 60 formed on the surface of the wafer W by the action of active species such as radicals and ions within the plasma such that the silicon oxide film 70 of the damage-free state is formed.

<Plasma Oxidation Process Condition>

Conditions for the plasma oxidation process performed in the plasma oxidation processing apparatus 100 will be described. In some embodiments, the process gas may include Ar gas as the inert gas and O$_2$ gas as the oxygen-containing gas. The flow rate (e.g., volume ratio) of the O$_2$ gas contained in the process gas may be ranging from 0.1% to 10%, more preferably, from 0.5% to 2% in terms of planarizing the surface of the silicon oxide film and the Si/SiO$_2$ interface by generating high density ions.

Moreover, a process pressure may be set to be in the range of 1.3 Pa to 266.6 Pa, more preferably, 6.7 Pa to 133 Pa in terms of planarizing the surface of the silicon oxide film and the Si/SiO$_2$ interface by generating high density ions.

In the present embodiment, during the plasma oxidation process, the high-frequency power of a predetermined frequency is supplied from the high-frequency power source 44 to the electrode 42 of the mounting table 2. The frequency of the high-frequency power supplied from the high-frequency power source 44 may be ranging from, e.g., 100 kHz to 60 MHz, more preferably, from 400 kHz to 13.5 MHz, in some embodiments. The high-frequency power is a power density per unit area of the wafer W. Therefore, the high-frequency power may be supplied in the range of, for example, 0.14 W/cm$^2$ to 2.13 W/cm$^2$, more preferably, 0.23 W/cm$^2$ to 1.2 W/cm$^2$ in some embodiments.

Moreover, the high-frequency power may be ranging from 100 W to 1500 W, more preferably, from 300 W to 1000 W in some embodiments. The high-frequency power supplied to the electrode 42 of the mounting table 2 serves to attract the ion species of the plasma toward the wafer W while maintaining the low electron temperature in the plasma. Therefore, by supplying the high-frequency power to the electrode 42 of the mounting table 2 so as to apply the RF bias to the wafer W, the plasma oxidation rate may be increased. Also, in the present embodiment, although the RF bias is applied to the wafer W, the plasma has a low electron temperature to inflict less plasma damage by ions or the like in the plasma on the silicon oxide film such that the silicon oxide film having a superior quality may be formed at a low temperature in a short period of time.

A power density of the microwave in the plasma oxidation process may be ranging from 0.255 W/cm$^2$ to 2.55 W/cm$^2$ in terms of generating the plasma stably and uniformly. Further, in the present embodiment, the power density of the microwave may refer to a microwave power per unit area of 1 cm$^2$ of the wafer W. For example, if a wafer W having a diameter of 300 mm or more is processed, a microwave power may be ranging from 500 W to 5000 W, more preferably, 1000 W to 4000 W.

The heating temperature of the wafer W is a temperature of the mounting table 2. For example, the heating temperature may be ranging from a room temperature (about 25° C.) to 600° C., preferably, from 200° C. to 500° C., and more preferably, from 400° C. to 500° C.

The conditions as described above are stored as the recipes in the storage unit 53 of the control unit 50. The process controller 51 retrieves the recipes and transmits control signals corresponding to the retrieved recipes to the respective components of the plasma oxidation processing apparatus 100, for example, the gas supply system 18, the gas exhaust unit 24, the microwave generating unit 39, the heater power supply 5a, the RF source 44, and the like, thereby realizing the plasma oxidation process under desired conditions.

In the method of forming the silicon oxide film according to the present disclosure, the high-frequency power supplied to the electrode 42 of the mounting table 2 serves to attract ions of the plasma toward the wafer W to thereby increase the oxidation rate extremely as well as the process pressure is set to be 266.6 Pa or lower and a ratio of O$_2$ in the process gas is set to be 10% or lower. With such condition settings, oxidation mainly performed by ions acting as active oxidative species is realized.

In this way, through the plasma oxidation process by use of the plasma oxidation processing apparatus 100, it is possible to form the silicon oxide film 70, which has a planarized surface, a planarized Si/SiO$_2$ interface, and a superior durability as an insulating film, to a desired thickness of, for example, 2 nm to 15 nm, preferably, 4 nm to 10 nm. The silicon oxide film 70 formed as described above may be applicable to a gate insulating film of, for example, a transistor or a memory device.

In some embodiments, for more improving a film quality of the silicon oxide film as formed, a heating process may be performed at a temperature ranging from 800° C. to 1100° C., preferably, from 850° C. to 950° C. during a short period of time (e.g., 5 to 60 seconds, preferably, 10 to 30 seconds) in a gas atmosphere such as NO gas, N$_2$O gas, or the like. By adding the heating process, defects such as a Si—O combination in the silicon oxide film and the like are effectively recovered to more improve the film quality.

Figure 5:
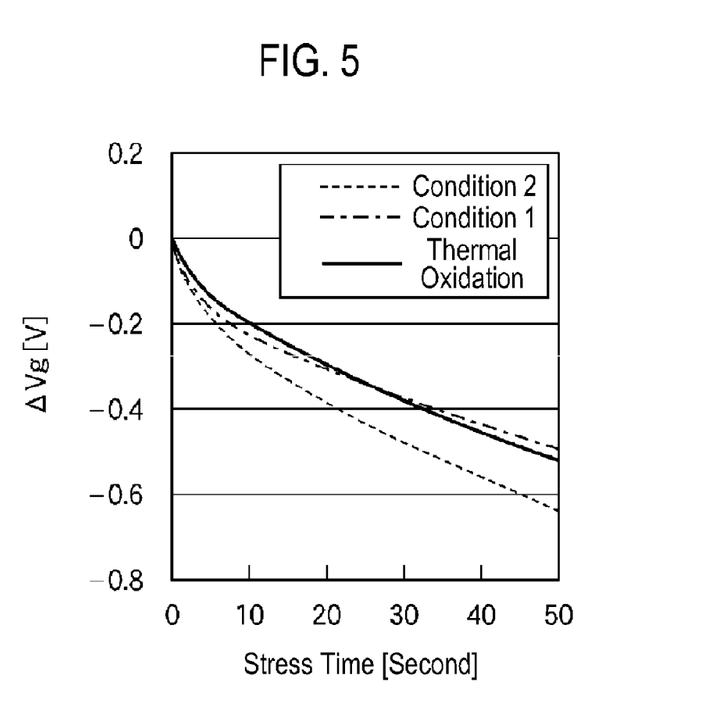
FIG. 5 is a graph showing the result of a time dependent dielectric breakdown (TDDB) test.
Figure 6:
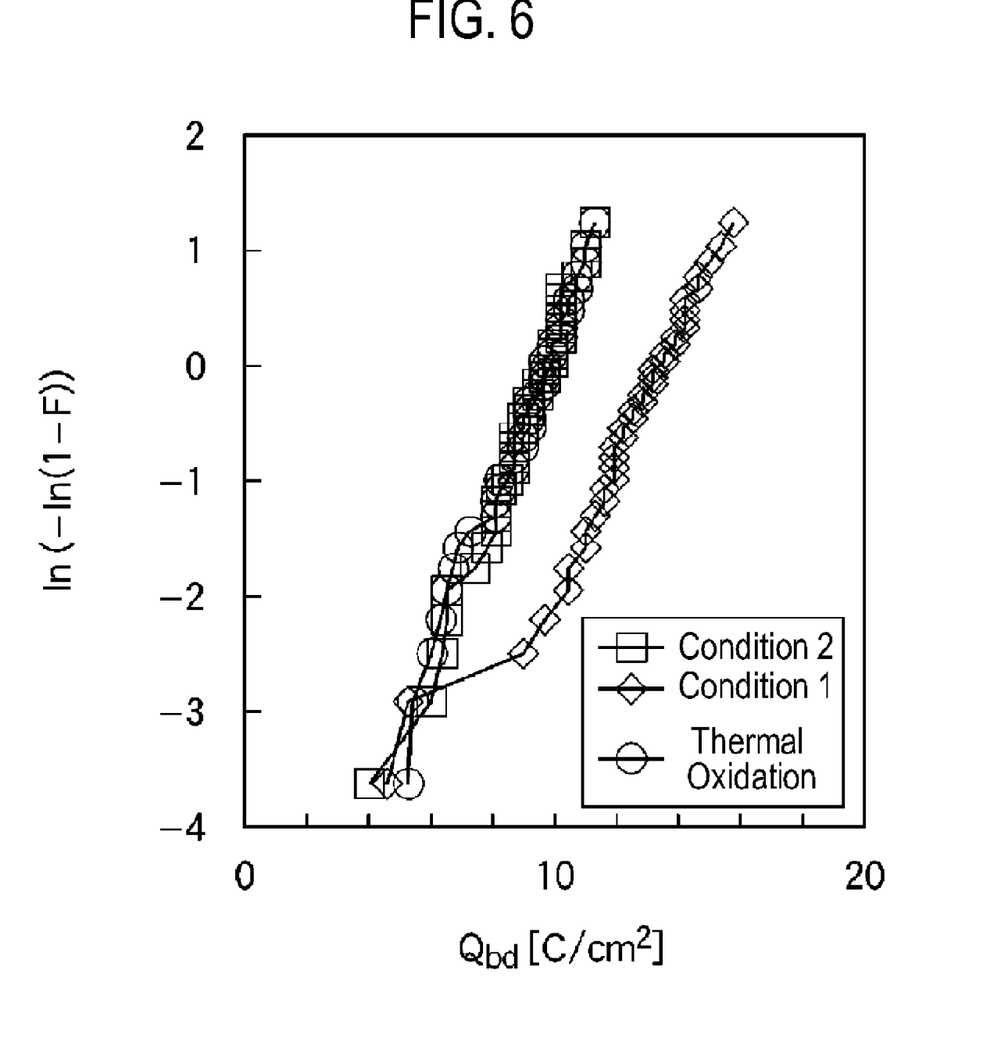
FIG. 6 is a graph showing the measurement result of a charge-to-breakdown (Qbd) test.

Now, a result of testing effects of the embodiments of the present disclosure will be described. With the plasma oxidation processing apparatus 100, a plasma oxidation process is performed on a silicon substrate under two conditions (e.g., Condition 1 and Condition 2) to form a silicon oxide film. Under Condition 1, an RF bias is applied to the substrate (e.g., the wafer W) under a low pressure and a low oxygen concentration, whereas under Condition 2, an RF bias is applied to the substrate under a pressure and an oxygen concentration relatively higher than those in Condition 1. Hereinafter, for convenience, Condition 1 is sometimes referred to as "a low-pressure & low-oxygen biasing," whereas Condition 2 is sometimes referred to as "a high-pressure & high-oxygen biasing." By use of a silicon oxide film (having a film thickness of 8 nm) formed under each of Conditions 1 and 2 as a gate insulating film of a MOS (Metal Oxide Semiconductor) capacitor, a constant current (TDDB: Time Dependent Dielectric Breakdown) test (e.g., an aging dielectric breakdown test) was performed by applying a stress of 0.1 A/cm$^2$ at 120° C. to measure the total amount of electrons passing the gate insulating film up to a dielectric breakdown (Qbd: charge-to-breakdown). FIG. 5 shows the result of the TDDB test whereas FIG. 6 shows the measurement result of Qbd. Herein, "F" on the longitudinal axis of FIG. 6 denotes an accumulated defect of the MOS capacitor. For the purpose of comparison, an electric property test is accordingly performed on a silicon oxide film formed through a wet thermal oxidation process at 800° C. while being assembled with a device.

<Condition 1>
Process pressure: 133.3 Pa
Ar gas flow rate: 990 mL/min(sccm)
O$_2$ gas flow rate: 10 mL/min(sccm)
Frequency of high-frequency power: 13.56 MHz
High-frequency power: 600 W (power density: 0.849 W/cm$^2$)
Microwave frequency: 2.45 GHz
Microwave power: 4000 W (power density: 2.05 W/cm$^2$)
Process temperature: 465° C.
Objective film thickness: 8 nm (456 seconds)
Wafer diameter: 300 mm
<Condition 2>
Process pressure: 667 Pa
Ar gas flow rate: 1200 mL/min(sccm)
O$_2$ gas flow rate: 388 mL/min(sccm)
H$_2$ gas flow rate: 12 mL/min(sccm)
Frequency of high-frequency power: 13.56 MHz
High-frequency power: 600 W (power density: 0.849 W/cm$^2$)
Microwave frequency: 2.45 GHz
Microwave power: 4000 W (power density: 2.05 W/cm$^2$)
Process temperature: 465° C.
Objective film thickness: 8 nm (405 seconds)
Wafer diameter: 300 mm As shown in FIG. 5, the TDDB property is superior under the low-pressure & low-oxygen biasing condition 1 in comparison with the high-pressure & high-oxygen biasing condition 2. Moreover, this condition 1 shows durability equal to or greater than that of the thermal oxidation. Under the low-pressure & low-oxygen biasing condition 1, the ionic character in the plasma becomes strong to cause ions to concentrate on protrusion portions on a Si surface, thereby allowing a selective oxidation. As a result, it is considered that the surface of the silicon oxide film and the Si/SiO$_2$ interface are planarized to thereby improve the TDDB property. As shown in FIG. 6, it can be understood that Qbd values under the thermal oxidation and the high-pressure & high-oxygen biasing condition 2 represent approximately same profiles. By taking into account this result, the silicon oxide film formed under the low-pressure & low-oxygen biasing condition 1 shows a high Qbd value and a high reliability in comparison with the thermal oxidation and the high-pressure & high-oxygen biasing condition 2.

From the above results, it is possible to form a silicon oxide film to a desired film thickness, having an excellent durability serving as an insulating film and a high reliability, under the low-pressure & low-oxygen biasing condition 1.

Figure 7:
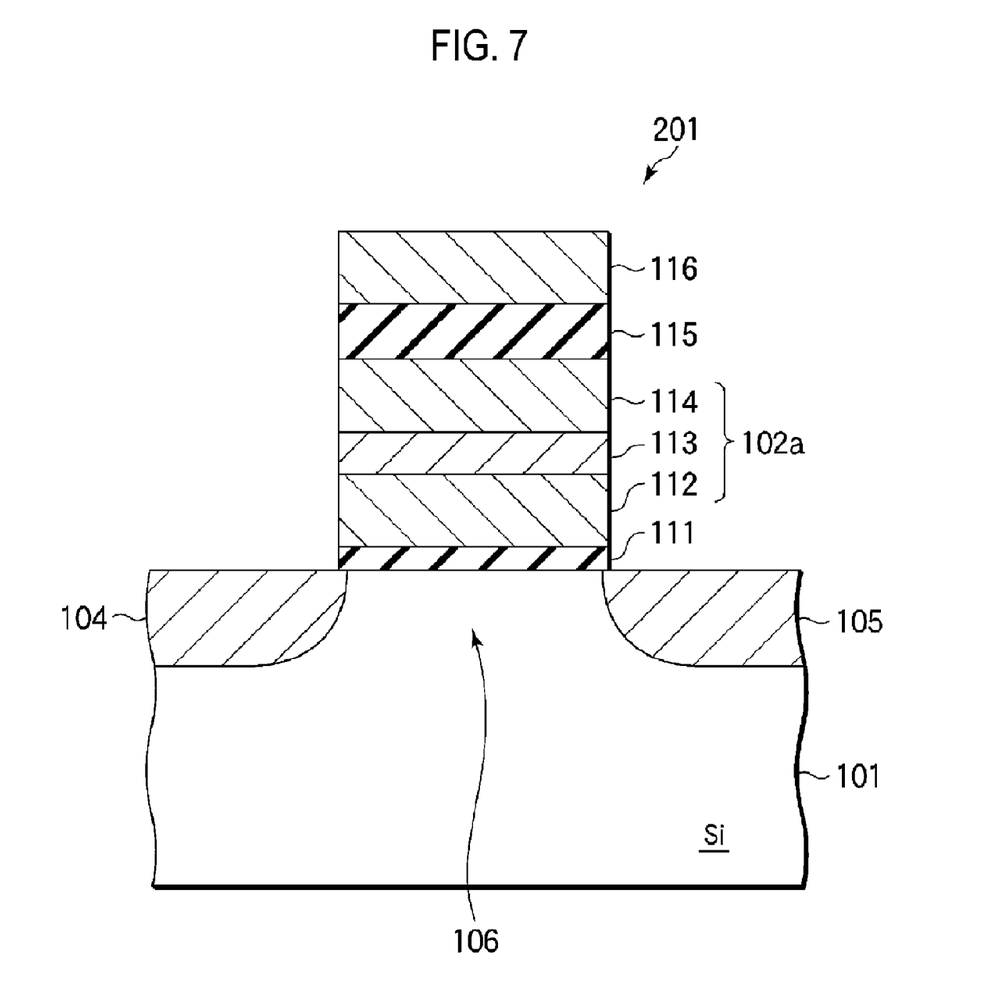

In some embodiments, the silicon oxide film formed according to the present disclosure may be used as a tunnel oxide film of a relatively thick film which is used in a flash memory device and the like. For example, the silicon oxide film may be appropriately used as a gate insulating film (e.g., a tunnel oxide film) of a semiconductor memory apparatus 201 having an SONOS (Silicon-Oxide-Nitride-Oxide-Silicon) configuration as shown in FIG. 7. The semiconductor memory apparatus 201 includes a p-type silicon substrate 101 serving as a semiconductor layer, a gate insulating film 111 layered on the p-type silicon substrate 101, a first silicon nitride film 112, a second silicon nitride film 113, a third silicon nitride film 114, a block silicon oxide film 115, and a control gate electrode 116 layered over the block silicon oxide film 115. Among these, the first silicon nitride film 112, the second silicon nitride film 113, and the third silicon nitride film 114 constitute a silicon nitride film structure 102*a* which is a region serving to mainly accumulate electrons. First and second source/drain regions 104 and 105 of n-type diffusion layers are respectively formed on both sides of the control gate electrode 116 in a predetermined depth from a surface of the silicon substrate 101. A channel forming region 106 is provided between the first and second source/drain regions 104 and 105. By use of the silicon oxide forming method according to the present disclosure to form the gate insulating film 111, the semiconductor memory apparatus 201 may be guaranteed to have a high reliability.

Figure 8:
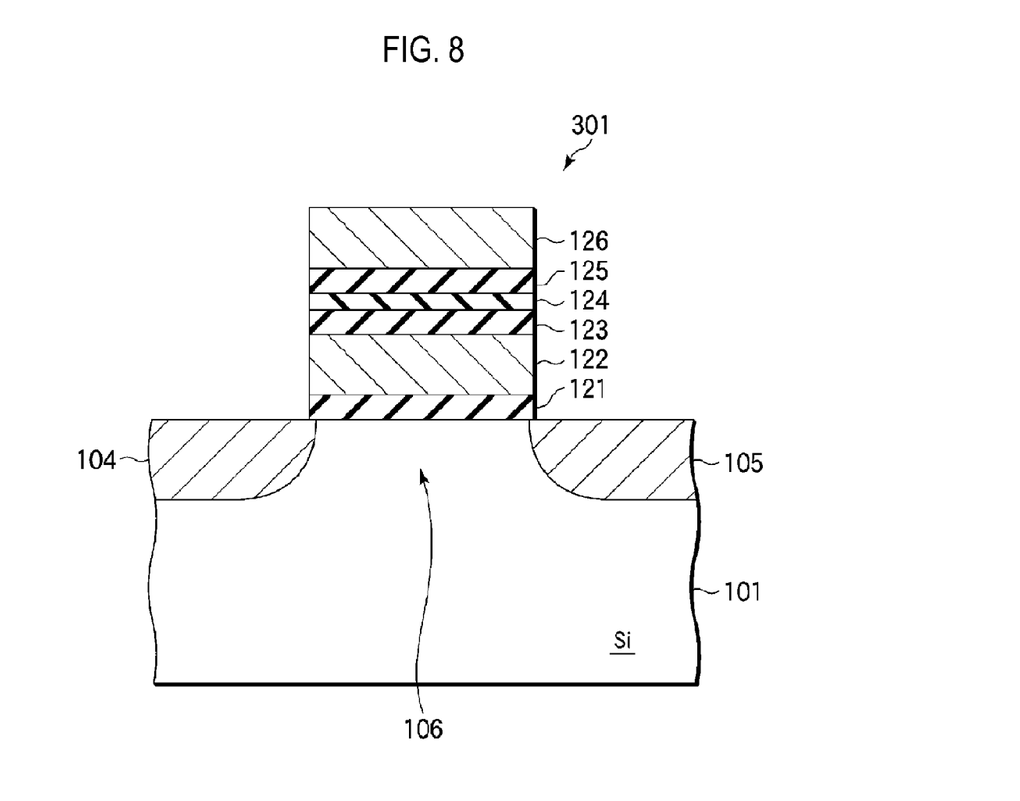

Moreover, in some embodiments, the silicon oxide film formed through the above method of the present disclosure may be appropriately used in, for example, a gate insulating film (e.g., a tunnel oxide film) of a semiconductor memory apparatus 301 of a floating gate configuration as shown in FIG. 8. The semiconductor memory apparatus 301 includes a p-type silicon substrate 101 serving as a semiconductor layer; a gate insulating film 121 layered and formed on the p-type silicon substrate 101; a floating gate electrode 122; an ONO (Oxide-Nitride-Oxide) structure made of a silicon oxide film 123, a silicon nitride film 124 and a silicon oxide film 125; and a gate electrode 126 layered on top of the ONO structure.

Further, first and second source/drain regions 104 and 105 of n-type diffusion layers are respectively formed in a predetermined depth from a surface of the silicon substrate 101. A channel-forming region 106 is provided between the first and second source/drain regions 104 and 105. By use of the silicon oxide forming method in accordance with the present disclosure to form the gate insulating film 121, the semiconductor memory apparatus 301 may be guaranteed to have a high reliability.

In the silicon oxide film forming method of the present disclosure, while a workpiece to be processed is biased by supplying a high-frequency power ranging from 0.14 W/cm$^2$ to 2.13 W/cm$^2$ per unit area of the workpiece to be processed to a mounting table on which the workpiece to be processed is placed, the plasma oxidation process is performed through a process gas containing oxygen in a ratio of 0.1% to 10% under a process pressure ranging from 1.3 Pa to 266.6 Pa. As a result, it is possible to form the silicon oxide film having a high durability serving as an insulating film in a higher oxidation rate. The silicon oxide film thus formed, in some embodiments, may be applicable as a gate insulating material of, for example, a gate insulating film of a transistor, a tunnel oxide film of a flash memory device, and the like.

While some embodiments have been described, various variations and modifications may be made without being limited to the foregoing embodiments. For example, in some embodiments, the plasma oxidation process may be performed by additionally supplying a nitriding gas onto a substrate or nitriding the surface of the silicon oxide film. To do such a film forming process (e.g., a process for forming a film through oxidation and nitridization) on a silicon surface, in some embodiments, the plasma oxidation processing apparatus 100 of the present disclosure may be improved to perform a plasma nitriding process or a thermal nitriding process. In this case, an oxidation process and a subsequent nitriding process with respect to a silicon surface may be consecutively performed in the same processing chamber 1. Alternatively, in some embodiments, such a film forming process may be set to perform an additional nitriding process by using a plasma nitriding processing apparatus or a thermal nitriding processing apparatus different from the plasma oxidation processing apparatus 100.

In the above embodiments, the RLSA-type plasma processing apparatus has been described by way of example of an apparatus for performing the silicon oxide film forming method of the present disclosure. However, it is possible to employ another type plasma processing apparatus such as, for example, an ICP (Inductively-coupled plasma) type, an ECR (Electron Cyclotron Resonance) plasma type, a surface reflected wave plasma type, a magnetron plasma type, or the like.

While certain embodiments have been described, these embodiments have been presented by way of example only, and are not intended to limit the scope of the inventions. Indeed, the novel method and apparatus described herein may be embodied in a variety of other forms; furthermore, various omissions, substitutions and changes in the form of the embodiments described herein may be made without departing from the spirit of the inventions. The accompanying claims and their equivalents are intended to cover such forms or modifications which would fall within the scope and spirit of the inventions.

What is claimed is:

1. A method of forming a silicon oxide film on silicon exposed on a surface of a workpiece to be processed, the method comprising:
   mounting the workpiece on a mounting table in a processing chamber;
   generating a plasma of a process gas containing oxygen by supplying the process gas into the processing chamber;
   applying a bias to the workpiece by supplying a high-frequency power to the mounting table; and
   forming the silicon oxide film by applying the plasma to the biased workpiece and oxidizing the silicon,
   wherein a ratio of oxygen in the process gas is set to be in the range of 0.1% to 10%, a pressure in the processing chamber is set to be in the range of 1.3 Pa to 266.6 Pa upon forming the silicon oxide film, and an output of the high-frequency power is set to be in the range of 0.14 W/cm$^2$ to 2.13 W/cm$^2$ per unit area of the workpiece.

2. The method of claim 1, wherein a frequency of the high-frequency power ranges from 100 kHz to 60 MHz.

3. The method of claim 1, wherein a process temperature ranges from room temperature to 600° C. (degree Celsius) upon forming the silicon oxide film.

4. The method of claim 1, wherein the plasma is a microwave-excited plasma generated by exciting the process gas through a microwave introduced into the processing chamber from a planar antenna having a plurality of slots.

5. The method of claim 4, wherein a power density of the microwave ranges from 0.255 W/cm$^2$ to 2.55 W/cm$^2$ per unit area of the workpiece.

6. The method of claim 1, wherein the process gas is a mixed gas comprising Ar gas and O$_2$ gas.

7. The method of claim 1, wherein the ratio of oxygen in the process gas ranges from 0.5% to 2%.

8. The method of claim 1, wherein the pressure in the processing chamber ranges from 6.7 Pa to 133 Pa upon forming the silicon oxide film.

9. The method of claim 1, wherein the output of the high-frequency power is set to be in the range of 0.23 W/cm$^2$ to 1.2 W/cm$^2$ per unit area of the workpiece.

10. The method of claim 1, wherein the process temperature ranges from 200° C. to 500° C. upon forming the silicon oxide film.

11. An apparatus for forming a silicon oxide film, the apparatus comprising:
   a processing chamber having an opening at an upper portion of the processing chamber that allows a workpiece in the processing chamber to be processed at a pressure in the range of 1.3 Pa to 266.6 Pa;
   a dielectric member that covers the opening of the processing chamber;
   an antenna disposed on an outside portion of the dielectric member, the antenna configured to introduce an electromagnetic wave into the processing chamber;
   a gas introducing unit connected to a gas supply system, the gas introducing unit configured to supply a process gas containing oxygen from the gas supply system to the processing chamber such that a plasma of the process gas is generated by introducing the electromagnetic wave from the antenna, wherein a ratio of oxygen in the process gas supplied from the gas supply system is in a range between 0.1% to 10%;
   a gas exhaust conduit connected to a vacuum pump to depressurize and exhaust the interior of the processing chamber;
   a mounting table configured to hold the workpiece in place in the processing chamber, wherein the plasma of the process gas is applied to a silicon exposed on a surface of the workpiece;
   a high-frequency power source connected to the mounting table to supply to the mounting table with a high-frequency power in the range of 0.14 W/cm$^2$ to 2.13 W/cm$^2$ per unit area of the workpiece as an RF (Radio Frequency) bias to the workpiece; and
   a control unit that controls process conditions in the processing chamber based on a recipe that is retrieved from a memory unit.

* * * * *